(12) United States Patent
Kim

(10) Patent No.: US 11,309,411 B2
(45) Date of Patent: Apr. 19, 2022

(54) INSULATED GATE BIPOLAR TRANSISTOR AND METHOD OF MANUFACTURING SAME

(71) Applicant: DB HiTek Co., Ltd., Seoul (KR)

(72) Inventor: Young-Seok Kim, Seongnam-si (KR)

(73) Assignee: DB HiTek Co., Ltd., Seoul (KR)

( * ) Notice: Subject to any disclaimer, the term of this patent is extended or adjusted under 35 U.S.C. 154(b) by 0 days.

(21) Appl. No.: 16/891,433

(22) Filed: Jun. 3, 2020

(65) Prior Publication Data
US 2021/0384334 A1    Dec. 9, 2021

(51) Int. Cl.
*H01L 29/739* (2006.01)
*H01L 29/417* (2006.01)
*H01L 29/66* (2006.01)
*H01L 29/10* (2006.01)

(52) U.S. Cl.
CPC ...... *H01L 29/7397* (2013.01); *H01L 29/1095* (2013.01); *H01L 29/41708* (2013.01); *H01L 29/66325* (2013.01)

(58) Field of Classification Search
CPC ............. H01L 29/7397; H01L 29/1095; H01L 29/41708; H01L 29/66325
See application file for complete search history.

(56) References Cited

U.S. PATENT DOCUMENTS

| 2013/0037853 | A1* | 2/2013 | Onozawa | H01L 29/0839 257/139 |
| 2014/0145239 | A1* | 5/2014 | Oki | H01L 29/7397 257/139 |
| 2015/0014743 | A1* | 1/2015 | Werber | H01L 29/4236 257/140 |
| 2015/0021658 | A1* | 1/2015 | Lee | H01L 29/402 257/140 |
| 2015/0349103 | A1* | 12/2015 | Onozawa | H01L 29/0696 257/144 |

FOREIGN PATENT DOCUMENTS

KR    20090070516 A    7/2009

* cited by examiner

*Primary Examiner* — Stephen M Bradley
*Assistant Examiner* — Wasiul Haider
(74) *Attorney, Agent, or Firm* — Andrew D. Fortney; Central California IP Group, P.C.

(57) ABSTRACT

The present invention relates to an insulated gate bipolar transistor (IGBT) and, more particularly, to an insulated gate bipolar transistor that has multiple mesas having different widths, configured to promote the buildup and accumulation of hole carriers, thereby facilitating relatively easy subsequent processing, while maximizing conductivity modulation.

7 Claims, 11 Drawing Sheets

INSULATED GATE BIPOLAR TRANSISTOR AND METHOD OF MANUFACTURING SAME

BACKGROUND OF THE INVENTION

Field of the Invention

The present invention relates to an insulated gate bipolar transistor (IGBT) and, more particularly, to a bipolar transistor that has multiple mesa regions having different widths, that may promote the buildup and accumulation of hole carriers, thereby facilitating subsequent processing, while maximizing conductivity modulation.

Description of the Related Art

An insulated gate bipolar transistor (IGBT) is an ideal device that combines an insulated gate structure of a MOS transistor with the high current density capability of a bipolar transistor.

Specifically, an insulated gate bipolar transistor has an advantage of bipolar operation, which can significantly reduce on-resistance by conductivity modulation.

FIG. 1 is a cross-sectional view of an insulated gate bipolar transistor in the related art; and FIG. 2 is a graph showing that the conductivity modulation changes according to the width of the mesa region.

Referring to FIG. 1, an IGBT technology in the related art was developed to maximize conductivity modulation, and for this purpose, it is common to store hole carriers (i.e., holes) inside a bipolar transistor, such as IGBT 9. In order to maximize conductivity modulation, it is common to induce the buildup of hole carriers, and thus accumulate the hole carriers, by reducing the width of the mesa region M between a pair of adjacent trench gates 910.

Therefore, to induce the accumulation of the hole carriers as described above, the width of the mesa region M must be below a predetermined value. However, it is difficult to secure enough space to form the emitter 930, the ion implantation region 950, and/or the pad 970, which typically require more detailed and/or complicated subsequent processing. For example, when the distance between the adjacent trench gates 910 is too short, there is a possibility that the resist pattern for forming the emitter 930 and/or ion implantation region 950 is ineffective or changes so that the desired pattern is not formed. Therefore, the method of narrowing the width of the mesa region M in the related art is inevitably a factor that increases processing costs and time.

In order to solve this problem, the present invention provides an insulated gate bipolar transistor and a method of manufacturing the same, where the transistor has sufficient distance between adjacent trench gates in the MOSFET operating region to facilitate relatively easy subsequent processing, while still inducing the accumulation of hole carriers.

SUMMARY OF THE INVENTION

Accordingly, the present invention has been made keeping in mind the above problems occurring in the prior art, and an objective of the present invention is to provide an insulator gate bipolar transistor and a method of manufacturing the same, the transistor having a plurality of mesa regions having different widths (e.g., each mesa region having a different width from the other mesa region[s]) and being configured to promote the buildup and accumulation of hole carriers (i.e., holes), thereby maximizing conductivity modulation and facilitating relatively easy subsequent processing in the MOSFET (e.g., insulated gate) region.

In addition, an objective of the present invention is to provide an insulated gate bipolar transistor and a method of manufacturing the same, in which a first mesa having a first, relatively large width is in the MOSFET region (e.g., a mesa region thereof), and a second mesa having a second, relatively narrow width is in the BJT region (e.g., the mesa region thereof), thereby facilitating the accumulation of hole carriers in the BJT region and subsequent processes in the MOSFET region (e.g., in a body region thereof).

In addition, an objective of the present invention is to provide an insulated gate bipolar transistor and a method of manufacturing the same, in which a plurality of second mesas are repetitive, and have a width within a limited range, thereby further maximizing the conductivity modulation.

In addition, an objective of the present invention is to provide an insulated gate bipolar transistor and a method of manufacturing the same, in which the hole carrier can be easily moved, and thus the switching speed can be faster, by forming first and second body contact regions having a first conductivity type and a concentration higher than an impurity concentration in the body region.

The present invention can be implemented by various embodiments having the following configurations to achieve the above-described objects.

According to one or more embodiments of the present invention, an insulated gate bipolar transistor includes a collector electrode; a collector layer on the collector electrode, the collector layer having a first conductivity type; a buffer layer on the collector layer, the buffer layer having a second conductivity type; a drift region on the buffer layer, the drift region having the second conductivity type; a body region on the drift region, the body region having the first conductivity type; a plurality of trench gates penetrating the body region (e.g., from a surface of the body region), configured to separate a first region from a second region in the body region; an interlayer insulating film covering a surface of the trench gate; and emitters spaced apart from each other on a surface of the body region in the first region, the emitters having the second conductivity type.

According to one or more other embodiments of the present invention, adjacent ones of the trench gates may be at boundaries of the first region and the second region, and distances between adjacent trench gates may be different (e.g., a distance between adjacent trench gates at opposite boundaries of the first region is different from a distance between adjacent trench gates at opposite boundaries of the second region).

According to at least one other embodiment of the present invention, the transistor may further include a first body contact overlapping the emitter in the first region, and a second body contact on or at the surface of the body region in the second region, wherein each of the first and second body contact regions have the first conductivity type.

According to at least one other embodiment of the present invention, the first region may include a first mesa, the second region may include a second mesa, and the first mesa may have a width larger than that of the second mesa.

According to at least one other embodiment of the present invention, the first region and the second region may be repetitive.

According to at least one other embodiment of the present invention, the IGBT may further comprise a plurality of second regions adjacent to the first region, and a device isolation layer penetrating the body region (e.g., from the surface of the body region), configured to form a boundary between adjacent second regions in the body region.

According to at least one other embodiment of the present invention, the first region may include a first mesa, the second region may include a second mesa, and a width of the first mesa may be larger than that of the second mesa.

According to other embodiments of the present invention, an insulated gate bipolar transistor according to the present invention includes a collector electrode; a collector layer on the collector electrode, the collector layer having a first conductivity type; a buffer layer on the collector layer, the buffer layer having a second conductivity type; a drift region on the buffer layer, the drift region having the second conductivity type; a body region on the drift region, the body region having the first conductivity type; a plurality of trench gates penetrating the body region (e.g., from a surface of the body region), configured to separate a first region from a second region in the body region; an interlayer insulating film covering a surface of the trench gates; emitters spaced apart from each other on the surface of the body region in the first region, the emitters having the second conductive type; a first body contact overlapping with the emitter in the first region, the first body contact having the first conductivity type; and a second body contact on the surface of the body region in the second region, wherein the second body contact has the first conductivity type and the first region has a width that is different from that of the second region.

According to at least one other embodiment of the present invention, adjacent ones of the trench gates may be on boundaries of the first region and the second region, and may include a gate insulating layer having an oxide film along an inner wall (e.g., of a trench containing one of the trench gates) and a gate electrode on an inner surface of the gate insulating layer.

According to at least one other embodiment of the present invention, a width of the first region may be larger than that of the second region.

According to at least one other embodiment of the present invention, the first region may include a first mesa, the second region may include a second mesa, and the first region and the second region may alternate repetitively (e.g., in a horizontal direction).

According to at least one other embodiment of the present invention, the IGBT may further comprise a plurality of second regions adjacent to the first region; and a device isolation layer penetrating the body region (e.g., from a surface of the body region), configured to separate adjacent second regions from each other in the body region, wherein a width of the first region may be larger than that of the second region.

According to at least one other embodiment of the present invention, a method of manufacturing an insulated gate bipolar transistor according to the present invention includes forming a buffer layer on a substrate having a first conductive type; forming a drift region on the buffer layer; forming a body region on the drift region; forming a resist pattern on a surface of the body region and implanting a high concentration of a second conductivity type impurity in the surface of the body region in a first region using the pattern as a mask to form an emitter and forming a trench gate by penetrating the body region from the surface of the body region to partition a MOSFET region from a BJT region.

According to at least one other embodiment of the present invention, distances between adjacent trench gates along a horizontal direction may be different from each other.

According to at least one other embodiment of the present invention, the first region may have a width larger than that of the second region.

According to at least one other embodiment of the present invention, the first region and the second region may be alternating and repetitive.

According to at least one other embodiment of the present invention, the method may further include forming a device isolation layer by penetrating the body region from the surface of the body region to form a boundary between adjacent second regions in the body region, to form a plurality of successive second regions are adjacent to and on one side of the first region.

According to at least one other embodiment of the present invention, a method of manufacturing an insulated gate bipolar transistor according to the present invention includes forming a buffer layer on a substrate having a first conductive type; forming a drift region on the buffer layer; forming a body region on the drift region; forming a resist pattern on a surface of the body region and implanting a high concentration of a second conductivity type impurity in the surface of the body region in a first region using the pattern as a mask to form an emitter forming a trench gate region by penetrating the body region (e.g., from the surface of the body region) to partition the first region from a second region, the first region having a larger width than that of from the second region; forming a first body contact partially overlapping the emitter in the first region, the first body contact having a high concentration of a first conductivity type impurity; and forming a second body contact by implanting the high concentration of the first conductivity type impurity into the surface of the body region in the second region.

The present invention has the following effects by one or more of the above configurations.

According to the present invention, a plurality of mesas having different widths may promote the buildup and accumulation of hole carriers (i.e., holes) to maximize the conductivity modulation and facilitate relatively easy subsequent processing in the MOSFET region.

In addition, according to the present invention, a first mesa having a relatively large width is in the MOSFET region, and a second mesa having a relatively narrow width is in the BJT region, which can facilitate accumulation of hole carriers in the second region and subsequent processing on and/or in the body region in the MOSFET region.

In addition, according to the present invention, the IGBT may include a plurality of repetitive second mesas having a width narrower than that/those of the first mesa(s), so that the second mesas have a width within a limited range, which may further maximize the conductivity modulation.

In addition, according to the present invention, there is an effect that hole(s) can be easily moved, and thus the switching speed can be faster, when the first and second body contact regions have a higher concentration of first conductivity type impurities than the body region.

Even if not explicitly mentioned herein, the effects described in the following specification, or expected or provided by the technical features of the present invention, and the potential effects thereof are considered as being described in the specification of the present invention.

BRIEF DESCRIPTION OF THE DRAWINGS

The above and other objects, features, and other advantages of the present invention will be more clearly understood from the following detailed description when taken in conjunction with the accompanying drawings, in which.

DETAILED DESCRIPTION OF THE INVENTION

Hereinafter, embodiments of the present invention will be described in detail with reference to the accompanying drawings. The described embodiments of the present invention can be modified in various forms, and the scope of the present invention should not be interpreted as being limited to the following embodiments, but should be interpreted based on the claims. Further, the embodiments described herein are provided only as a reference for more fully illustrating the present invention to those skilled in the art.

In the following description, one element being "on", "on the top of", "on an upper [or uppermost] side of", or "above" another element refers to the element being either in contact with a surface of another element, or at a certain distance from the other element. In the case where the element is a certain distance from the other element, one or more further elements may be between the two elements. Further, when one element is "directly on" another element or "just above" the other element, a further element can be between the two elements.

In addition, it should be noted that although "first" and "second" components are described below, the "second" component is not intended to be a premise of or to require the "first" component, but rather, is merely for the sake of explanation.

Meanwhile, when feasible, the functions or operations specified in a particular block or sequence may occur in a different order than those described (e.g., in a flow or flowchart). For example, the functions or operations of two consecutive blocks or processes may be performed substantially simultaneously, or may be performed in reverse order.

In embodiments described below, the first conductivity type may be, for example, P-type, and the second conductivity type may be, for example, N-type, but are not limited thereto.

Figure 1:
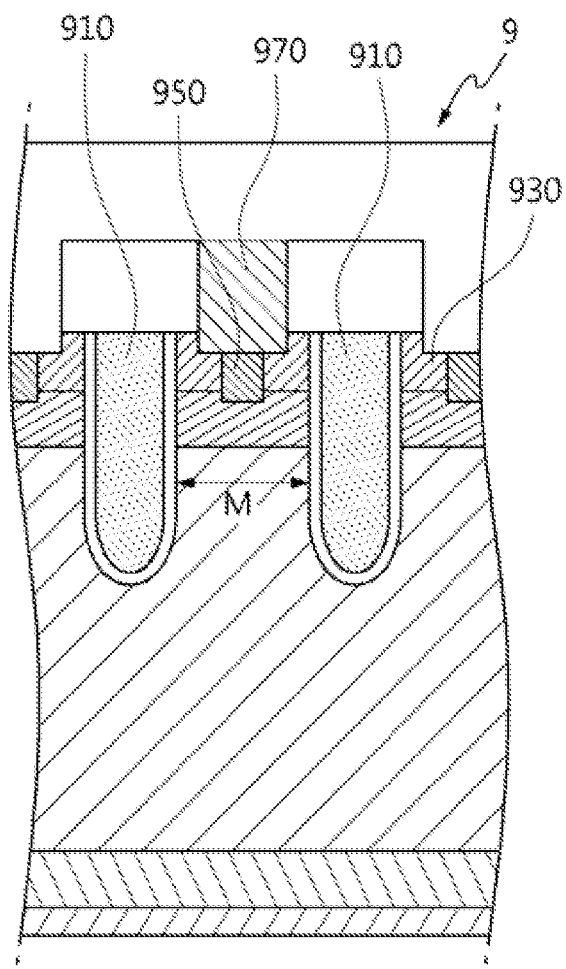
FIG. 1 is a cross-sectional view showing an insulated gate bipolar transistor in the related art.
Figure 2:
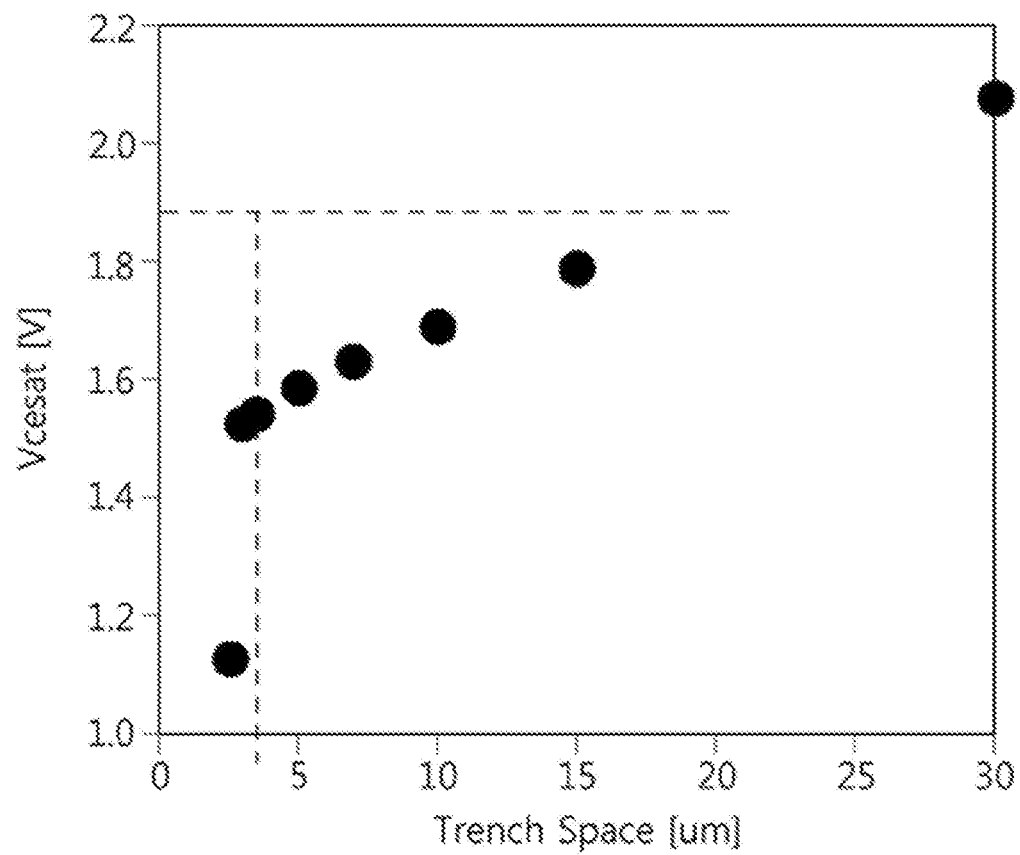
FIG. 2 is a graph showing that the conductivity modulation increases according to the width of the mesa.
Figure 3:
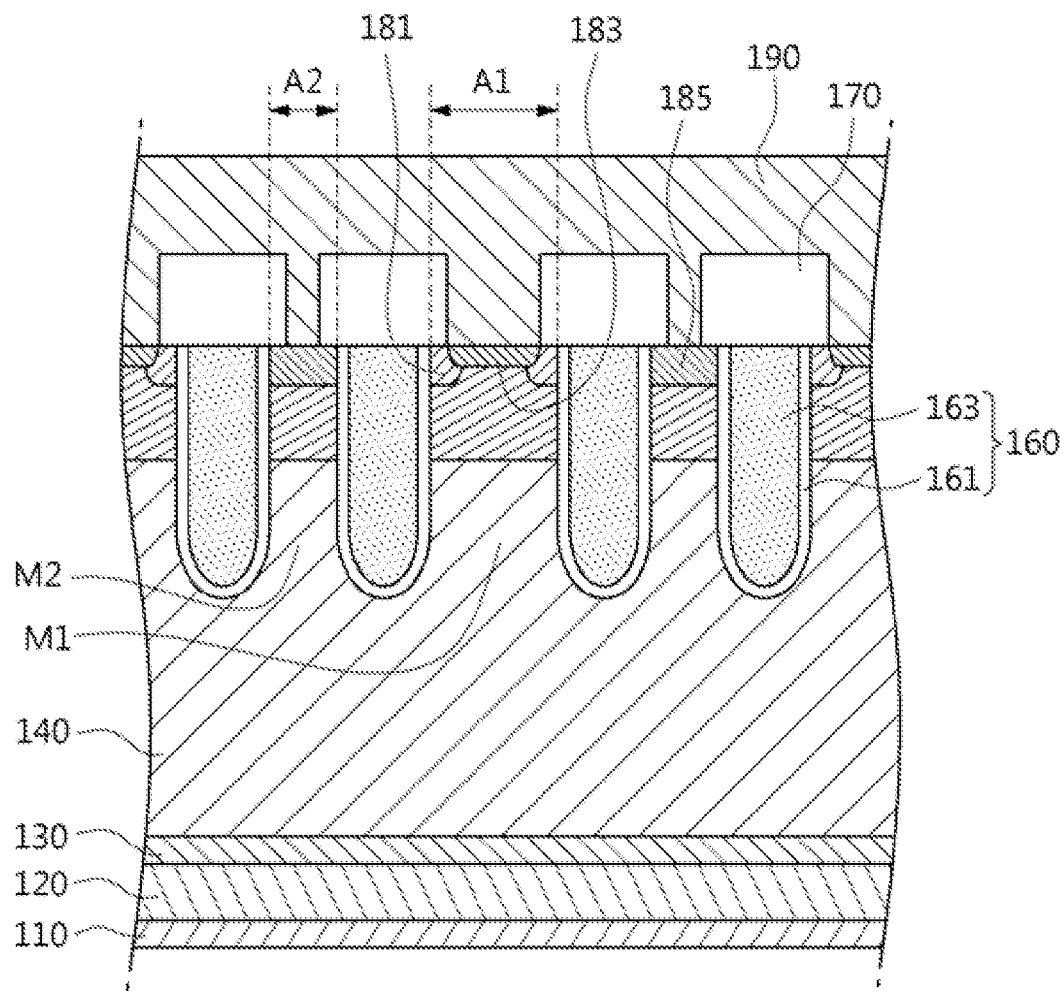
FIG. 3 is a cross-sectional view showing an exemplary insulated gate bipolar transistor according to one or more embodiments of the present invention.
Figure 4:
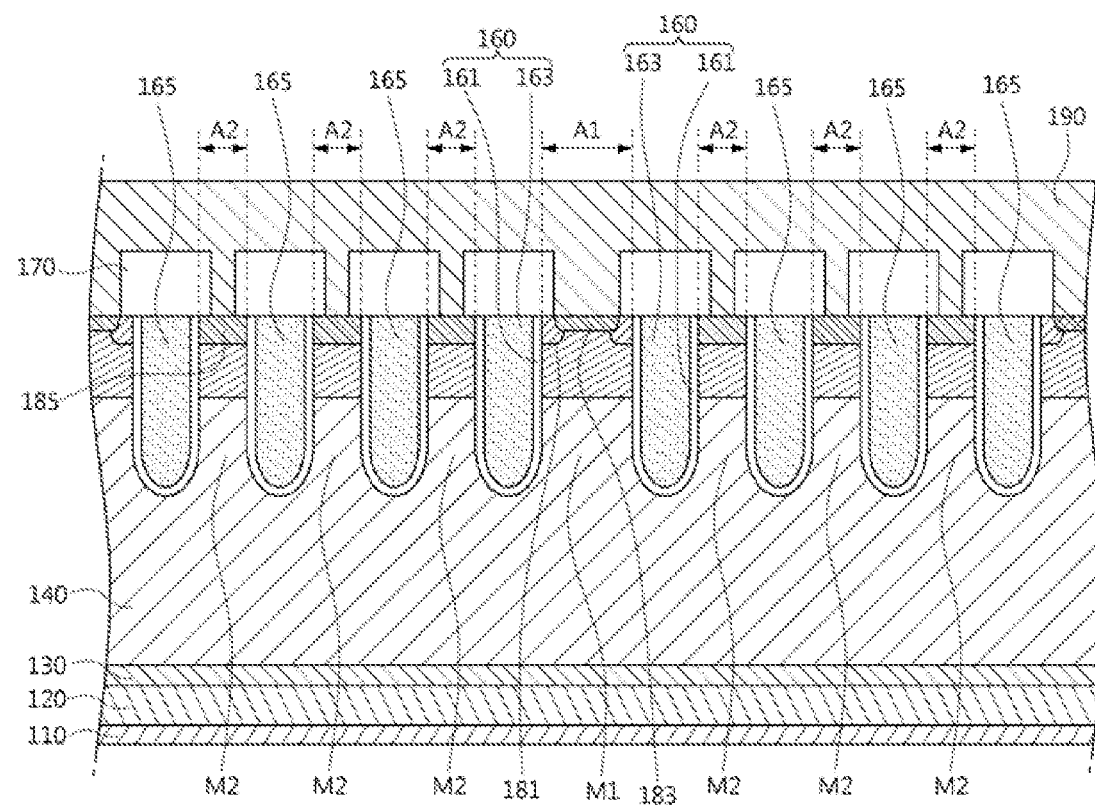
FIG. 4 is a cross-sectional view showing an exemplary insulated gate bipolar transistor, according to at least one other embodiment of the present invention.

FIG. 3 is a cross-sectional view showing an exemplary insulated gate bipolar transistor according to various embodiments of the present invention; and FIG. 4 is a cross-sectional view showing an exemplary insulated gate bipolar transistor, according to one or more other embodiments of the present invention.

Hereinafter, the insulated gate bipolar transistor according to various embodiments of the present invention will be described in detail with reference to the accompanying drawings.

Referring to FIG. 3, the present invention relates to an insulated gate bipolar transistor (IGBT), and more particularly, to a bipolar transistor that has multiple mesas with different widths, configured to promote the buildup and accumulation of hole carriers, thereby facilitating relatively easy subsequent processing and maximizing the conductivity modulation.

To this end, the insulated gate bipolar transistor may include a first region A1, which is a mesa in a region that operates like a metal oxide semiconductor field effect transistor (MOSFET), and a second region A2, which is a mesa in a bipolar junction transistor (BJT) region. The first region A1 and the second region A2 are separated from each other by a trench gate 160, and a plurality of the first regions A1 and the second regions A2 may alternate repetitively. Alternatively, multiple second regions A2 adjacent to the first regions A1 may be separated by an element isolation film and be repetitive, which will be described later.

First, a collector electrode 110 comprising, for example, an AlMoNiAu alloy, is on a lowermost side or surface of the insulated gate bipolar transistor, and a collector layer 120, which is a high concentration impurity region of a first conductivity type, is on the collector electrode 110. The collector layer 120 is a semiconductor layer. A buffer layer 130, which is a high concentration impurity region of a second conductivity type, is on the collector layer 120. In addition, a drift region 140, which is an impurity region of the second conductivity type, is on the buffer layer 130. For example, the drift region 140 may be a low concentration impurity region of the second conductivity type. As described later, the collector layer 120, the buffer layer 130, and the drift region 140 may be formed using, for example, an epitaxial process, but their formation is not limited thereto.

A body region 150, which is an impurity region of the first conductivity type is on the drift region 140, and a channel region 151 is in the body region 150. When a gate voltage turns on the IGBT, the channel region 151 is converted to a second conductivity type region to form a current path.

In addition, a trench gate 160 penetrates the body region 150 from the surface of the body region 150 (or, more specifically, from the surface of the body contacts 183 and/or 185 and/or the emitter 181). The trench gate 160 has a bottom or lowermost portion that partially penetrates the drift region 140. A plurality of trench gates 160 are spaced apart from each other, physically separating the first region A1 and the second region A2 from each other. That is, the first mesa M1 is defined in the first region A1 by two adjacent trench gates 160, and the second mesa M2 is defined in the second region A2 by another trench gate 160 spaced apart from the two adjacent trench gates 160 that define the first region A1.

Here, the width of the first mesa M1 is larger than the width of the second mesa M2. That is, the first mesa M1 has a relatively large width, the second mesa M2 has a relatively narrow width, and the "wide" mesa and the "narrow" mesa are relative to each other.

The trench gate 160 has a gate insulating film 161 having, for example, a U-shaped cross-section along a boundary thereof, and a gate electrode 163 on or within the inner wall or surface of the gate insulating film 161. For example, the gate insulating film 161 may be or comprise a silicon oxide layer, and the gate electrode may be or comprise a polysilicon layer doped with a second conductivity type impurity. As described above, the plurality of trench gates 160 are spaced apart from each other by a same or different predetermined distance.

In addition, an otherwise exposed surface of the gates 160 is covered with an interlayer insulating film 170, and an emitter electrode 190 is on the surface of the device, which includes an emitter 181, a first body contact region 183, and a second body contact region 185, which will be described later. The interlayer insulation film 170 is between the gates 160 and the emitter electrode 190. The emitter electrode 190 may be or comprise, for example, a polysilicon layer.

In addition, in the first region A1, emitters 181, which are high concentration impurity regions of a second conductivity type, are spaced apart from each other on the surface of the body region 150 and may have, for example, a band shape. The emitter 181 may have one end or side that is in contact with one side of the gate insulating film 161, and another end or side that is in contact with or that overlaps the first body contact region 183, which is a high concentration impurity region of the first conductivity type.

The first body contact region 183 in the first region A1 may have opposite sides in contact or partially overlapping with the emitter 181, and the bottom portion or bottommost surface thereof is in contact with the body region 150. The impurity concentration of the ion implantation region 183 is higher than the impurity concentration of the body region 150, and thus the hole carrier may easily move through the first body contact region 183, whereby the switching speed is faster.

In addition, a second body contact region 185 having a high concentration impurity region of a first conductivity type is on the surface of the body region 150 in the second region A2. The high concentration emitter 181 may not be in the second region A2. Therefore, even when the second mesa M2 has a narrow width, there is an advantage that relatively easy subsequent processing can be achieved.

Hereinafter, an operation method of the insulated gate bipolar transistor, problems thereof in the related art, and advantages of the insulated gate bipolar transistor according to embodiments of the present invention will be described in detail.

First, when a gate voltage is applied to the gate electrode 163, and a voltage differential exists between the gate electrode 163 and the emitter electrode 190, the IGBT turns on, and the channel region 151 inverts to form a current path. Electrons are injected from the emitter electrode 190 to the drift region 140 through the channel region 151, and holes are injected from the collector electrode 110 to the drift region 140.

Conduction modulation may occur as a result of injection of the electrons and/or the holes, as the holes may be generated from the collector electrode 110. The resistance of the drift region 140 may significantly decrease, and the current capacity may increase, as the number of the holes (e.g., in the drift region 140) increases due to conductivity modulation.

When the gate is turned off, the inverted channel region 151 returns or inverts back to the first conductivity type, and the injection of electrons from the emitter electrode 190 stops. Then, the electrons accumulated in the drift region 140 flow to the collector electrode 110, and the hole carriers flow to the emitter electrode 190.

In the course of such an operation, it is common to accumulate and/or concentrate the hole carriers by reducing the width of the mesa M between a pair of adjacent trench gates 160 in order to maximize the conductivity modulation. Therefore, in order to induce the accumulation of the hole carriers, the width of the mesa M must be below a predetermined value, as described above. However, when the width of the mesa M is below the predetermined value, it is difficult to form the emitter 181 and the first body contact region 183 in the first region A1, which results in more detailed and complicated subsequent processing. This inevitably causes an increase in the processing costs and processing time. More specifically, after the emitter 181 having a band shape is formed, it is very difficult to form a first body contact region 183 overlapping the emitter 181. That is, since the first body contact region 183 is formed by an ion implantation process using a resist pattern formed in the narrow first region A1 as a mask, there is an unacceptably high probability of misalignment or variation in the resist pattern across the wafer.

In order to solve the above-described problem, the insulated gate bipolar transistor according to embodiments of the present invention includes a relatively wide first mesa M1 in the first region A1, in which the first body contact region 183 is at a position overlapping the emitter 181, thereby facilitating relatively easy subsequent processing, and a relatively narrow second mesa M2 is in the second region A2, which does not include an emitter, thereby enabling the accumulation of hole carriers.

The distance between the trench gates 160 on opposite boundaries of the first region A1 is greater than that between the trench gates 160 on opposite boundaries of the second region A2. Therefore, the first region A1 has sufficient distance and/or free space for subsequent processes (e.g., to form the emitter 181 and/or the first body contact region 183).

In addition, as described above, as shown in FIG. 3, the first region A1 and the second region A2 may alternate and repeat. Alternatively, as shown in FIG. 4, a plurality of second regions A2 adjacent to the first region A1 may be present. Adjacent second regions A2 on the same side of the first region A1 may be separated from each other by a device isolation layer 165. In detail, a plurality of device isolation layers 165 may be spaced apart from the nearest trench gate 160 on the boundary of the first region A1. The distances between the device isolation layers 165 on the same side of the first region A1 may be substantially the same. A plurality of second regions A2 may be defined at least in part by the device isolation layers 165, and thus a plurality of second mesas M2 may be formed. When the plurality of second mesas M2 are formed, each second mesa M2 may have a narrower width (e.g., within a limited range), compared to the first region A1. Therefore, the accumulation of hole carriers (e.g., in the second mesas M2) may become easier.

A method of operating the bipolar transistor 1 according to the present invention, when a positive voltage differential is applied between the emitter electrode 190 and the collector electrode 110, and a voltage that turns on the IGBT (e.g., higher than a threshold voltage) is applied to the gate electrode 163, the channel region 151 inverts (e.g., becomes a second conductivity type region). Thereafter, electrons pass from the emitter electrode 190 through the first region A1, the emitter 181, the channel region 151, the drift region 140, and the collector layer 120, to the collector electrode 110. Therefore, a current flows from the collector electrode 110 to the emitter electrode 190.

Then, when the IGBT is turned off, electrons and hole carriers present in the drift region 140 move to the collector electrode 110 and the emitter electrode 190, respectively. The holes may move to the emitter electrode 190 through the first and second body contact regions 183 and 185.

In the above operation, the buildup and accumulation of hole carriers are induced in the second mesa M2 having a relatively narrow width, so that conductivity modulation may be maximized, and at the same time, the first body contact region 183 on the upper side of the first mesa M1 may be easily formed due to the first mesa M1 having a relatively large width.

FIGS. 5 to 11 are schematic cross-sectional views illustrating an exemplary method of manufacturing an insulated gate bipolar transistor according to one or more embodiments of the present invention.

Hereinafter, a method of manufacturing an insulated gate bipolar transistor according to embodiments of the present invention will be described in detail with reference to the accompanying drawings.

Figure 5:
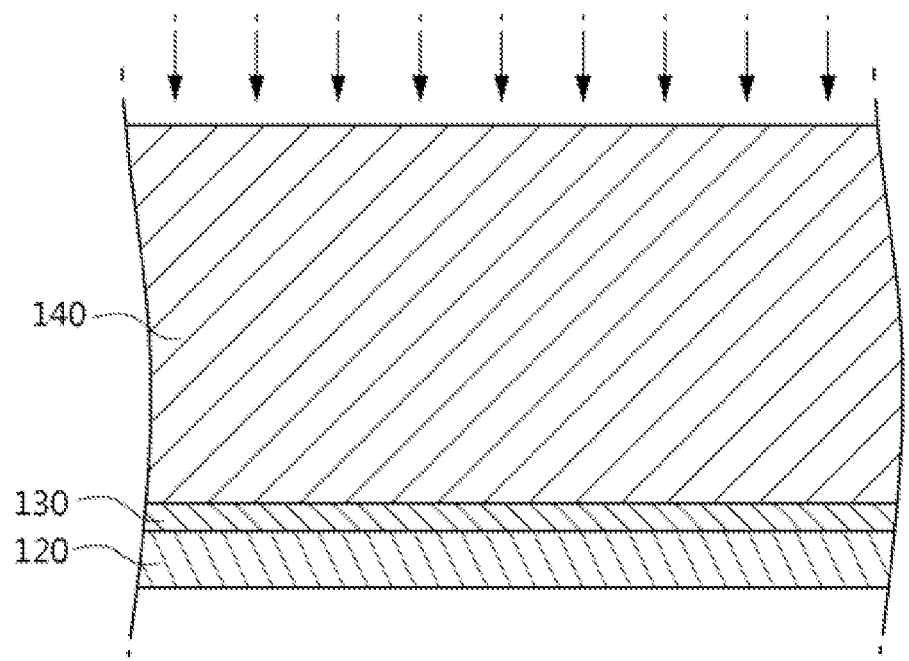
FIGS. 5 to 11 are schematic cross-sectional views showing an exemplary method of manufacturing an insulated gate bipolar transistor, according to one or more embodiments of the present invention.

First, referring to FIG. 5, for example, a buffer layer 130 is formed on a collector layer 120 having a first conductivity type. For example, the buffer layer 130 may have a high concentration of second conductivity type impurities, and the buffer layer 130 may be formed by epitaxial growth.

Then, a drift region 140 is formed on the buffer layer 130. The drift region 140 may have a low concentration of second conductivity type impurities. The buffer layer 130 and the drift region 140 may also be formed by epitaxial growth.

Figure 6:
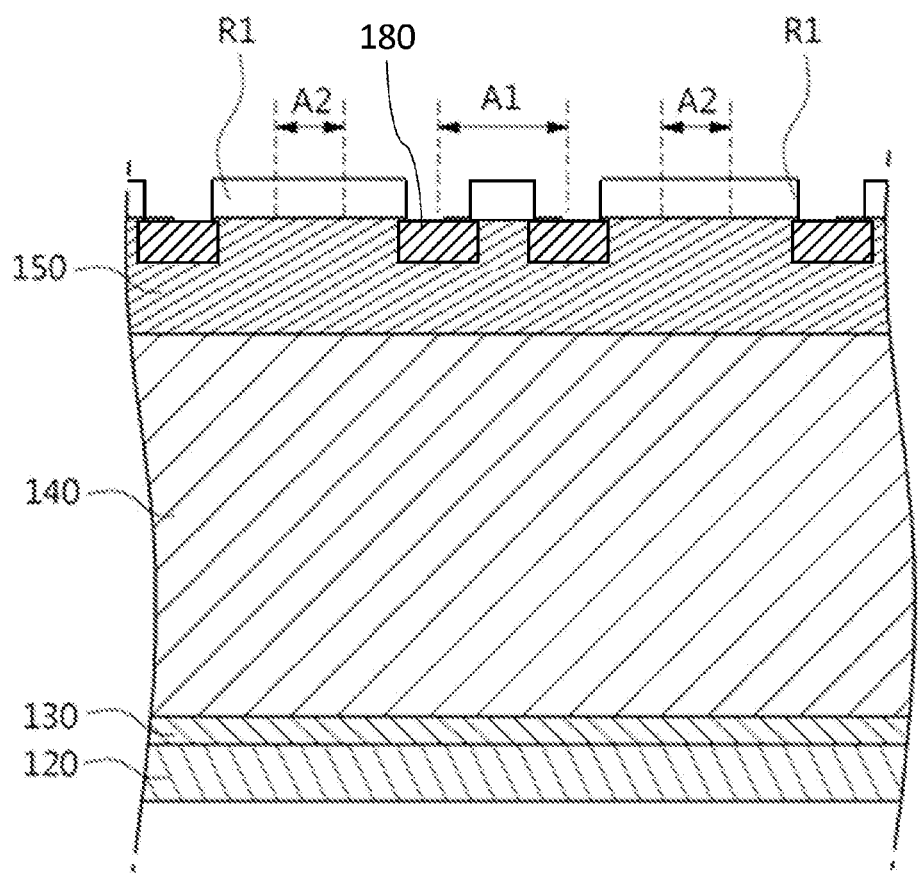

Referring to FIG. 6, a body region 150 is formed on or in the drift region 140. The body region 150 may be formed by, for example, implanting a first conductivity type impurity into the exposed surface of the drift region 140 and annealing the resulting structure in an oven or furnace.

Then, a first resist pattern R1 (which may have a band-shaped opening therein) is formed at locations corresponding in part to the emitters 181 (see FIG. 4) on the surface of the body region 150, a high concentration of a second conductivity type impurity is implanted into the surface of the body region 150 using the pattern R1 as a mask, and then the first resist pattern R1 is removed. An implant region 180 including the emitter 181 is formed in the first region A1 of the body region 150 as a result of the implantation (and subsequent annealing).

Figure 7:
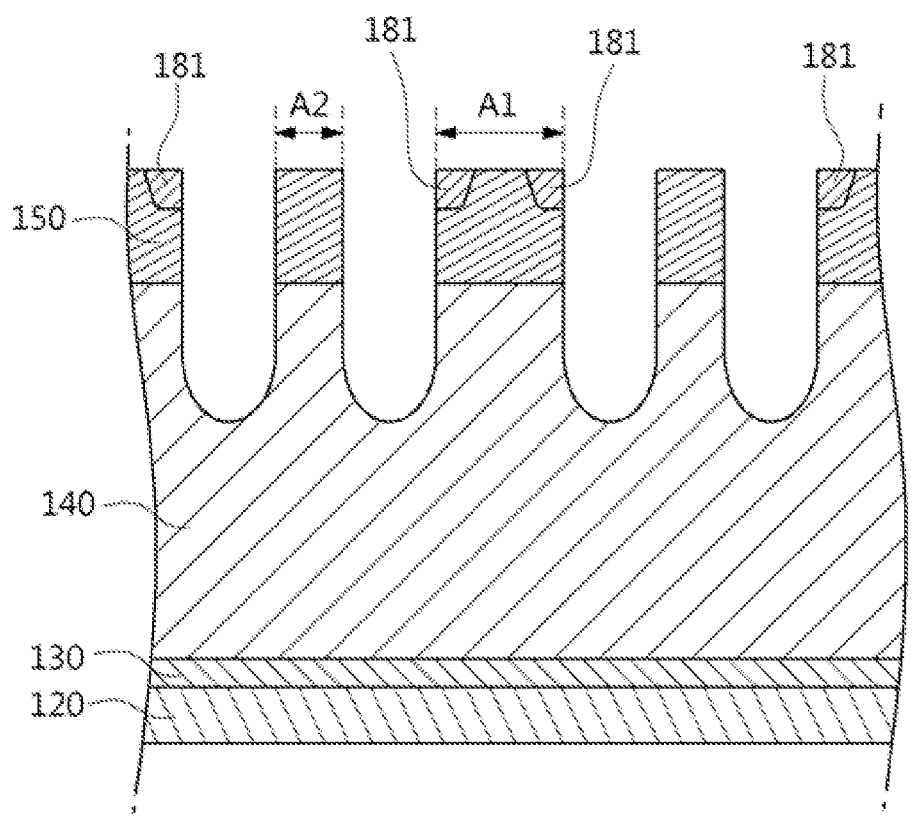

Then, referring to FIG. 7, an oxide film (not shown) is deposited and conventionally patterned to form a shield on the surface of the body region 150 in the first region A1 and the second region A2. The oxide film forms an etching mask. In addition, the exposed surface of the body region 150 is etched, thereby forming a trench that penetrates the body region 150 and partially penetrates the drift region 140. Accordingly, portions of the body region 150 in the first region A1 and the second region A2 are physically separated from each other. Here, in order to form a first mesa M1 having a relatively large width and a second mesa M2 having a relatively narrow width, the distances between the trenches may be different in the first and second regions A1 and A2 (i.e., the widths of the first and second regions A1 and A2 may be different). In addition, the distance between trenches on opposite boundaries of the first region A1 is larger than the distance between the trenches on the opposite boundaries of the second region A2.

In addition, when a plurality of second mesas M2 are formed as shown in FIG. 4, trenches for the device isolation layers 165 are formed at the same time as the trenches for the gates 160. After the process, the etching mask (e.g., oxide film) is removed.

Figure 8:
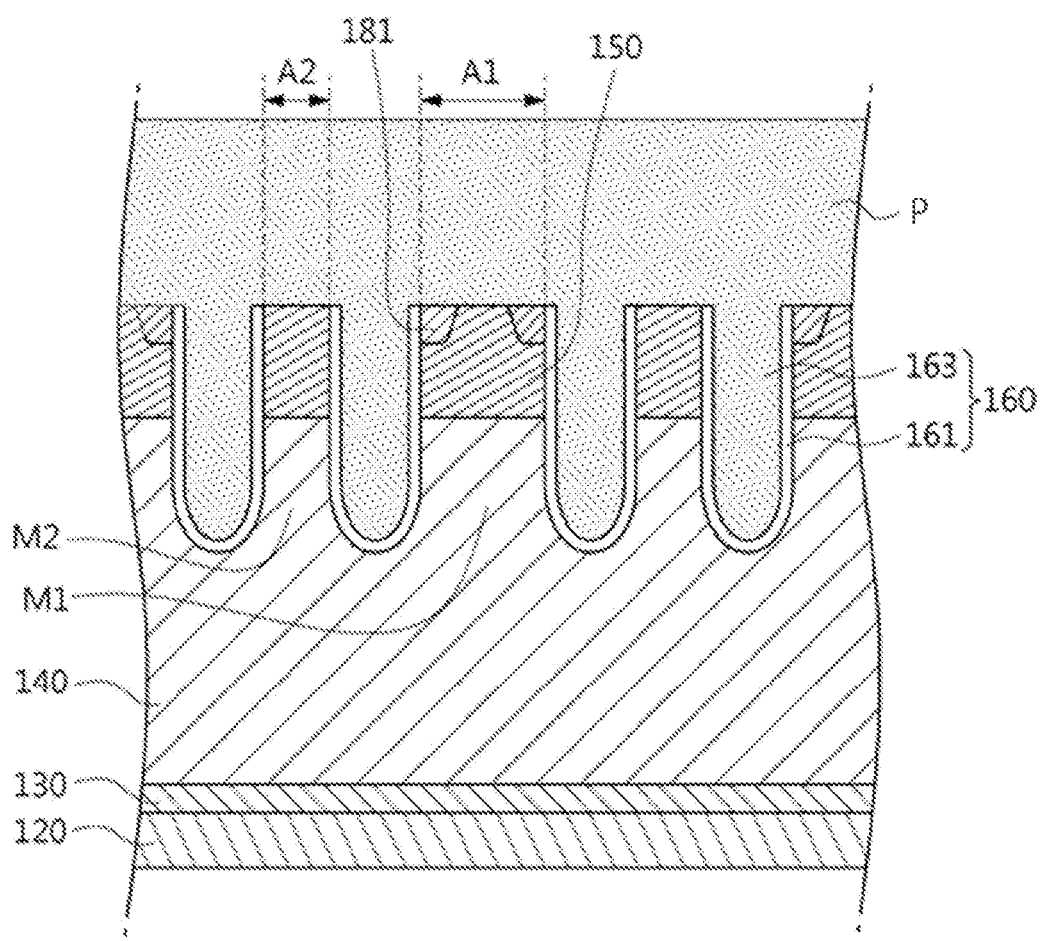

Subsequently, referring to FIG. 8, an oxide layer is formed or deposited on an exposed surface of the structure, including on the uppermost surface of the body region 150 and along an inner wall of the trenches to form a gate insulating film 161. Then, a polysilicon layer P is doped with a second conductivity type impurity is deposited on the gate insulating film 161, filling the trenches. The gate insulating film 161 on the uppermost surface of the body region 150 may be removed (e.g., by mechanical or chemical-mechanical polishing) before depositing the polysilicon layer P. Alternatively, the polysilicon layer P outside of the trenches and the gate insulating film 161 on the uppermost surface of the body region 150 may be removed in the same polishing process (see, e.g., FIG. 9) to form the gate electrodes 163. In embodiments related to the structure in FIG. 4, the trenches in which polysilicon is to be deposited may be masked (e.g., with a photoresist or a silicon nitride hard mask), then an element isolation layer is formed or deposited on the exposed gate insulating film 161 to form the device isolation layer 165 in manner similar to the polysilicon gates 163.

Figure 9:
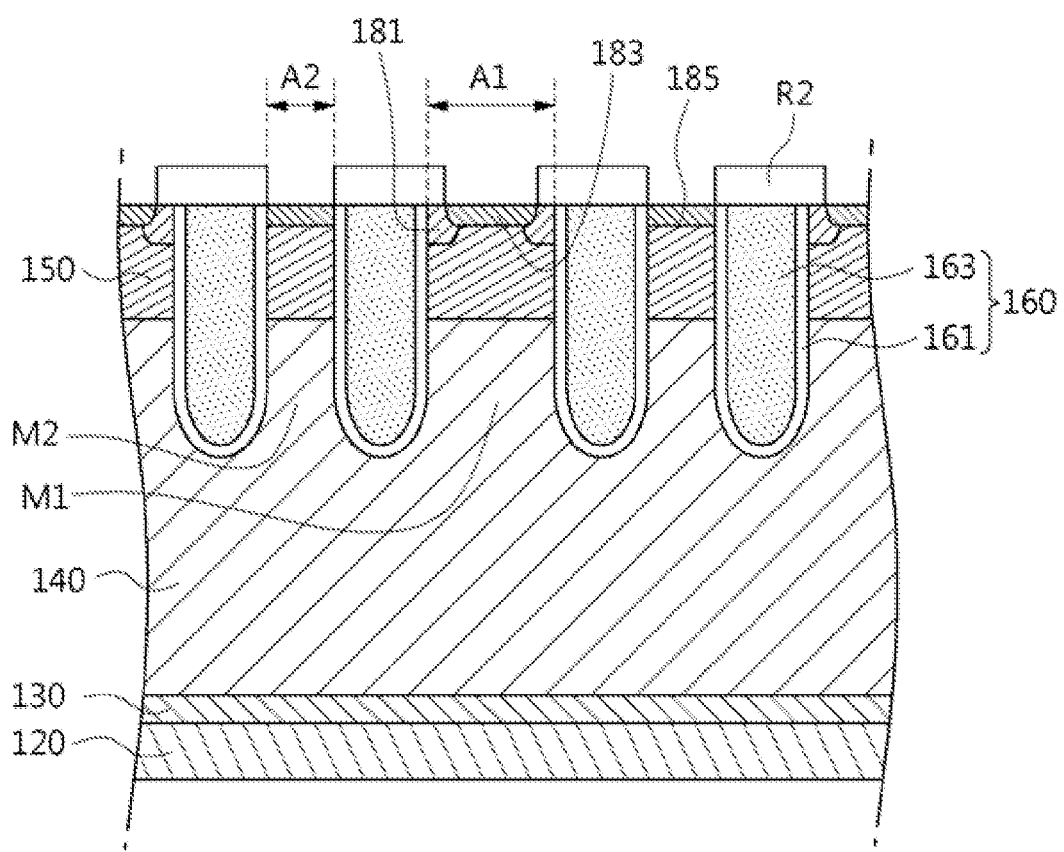

In a subsequent process, referring to FIG. 9, a second resist pattern R2 is formed over the gate electrodes 163, the gate insulating films 161, and a part of the emitters 181 adjacent to the border of the first region A1. Using the pattern R2 as a mask, a high concentration of first conductivity type impurities are implanted to form the first body contact 183 and the second body contact 185. Then, the second resist pattern R2 is removed. Then, the impurities in the first and second body contacts 183 and 185 are activated by a heat treatment process on the implanted high concentration first conductivity type impurities. The body contacts 183 and 185 are in direct contact with the body region 150.

Figure 10:
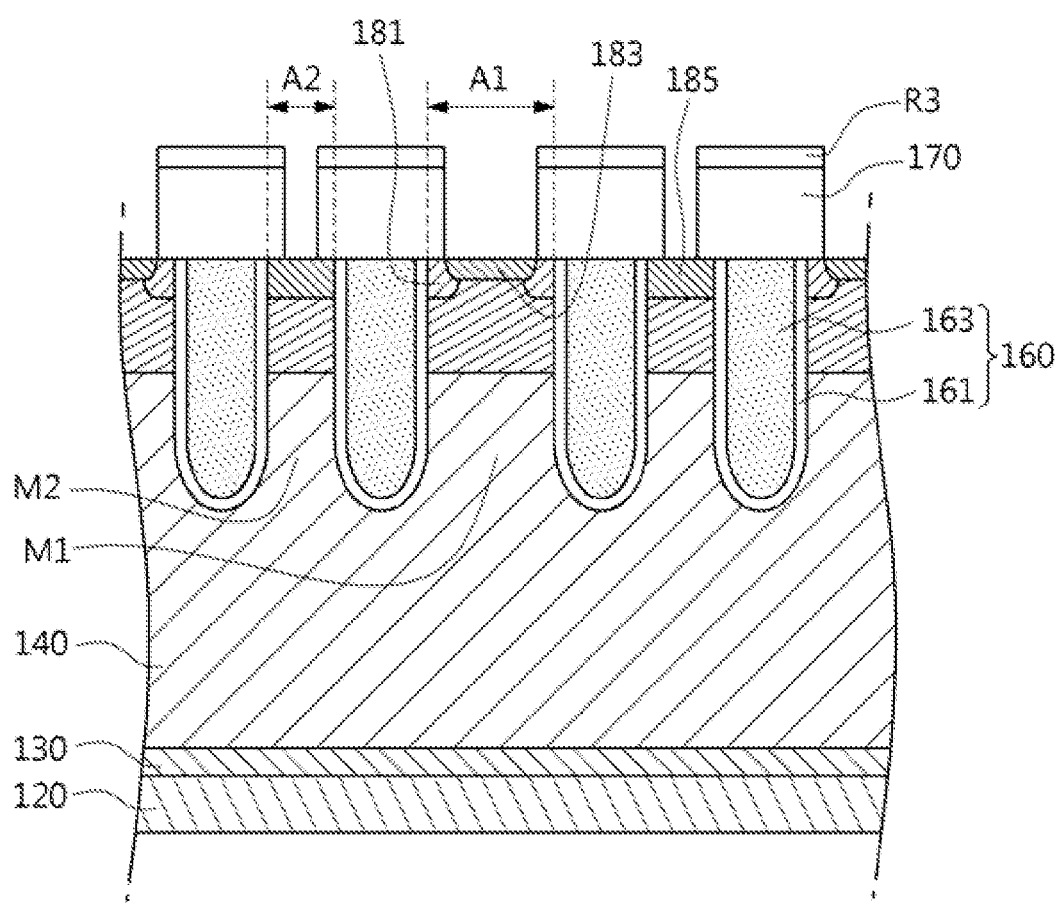

Thereafter, referring to FIG. 10, an insulating film (e.g., an interlayer insulating film 170) is deposited on the upper surfaces of the body region 150, the gates 160, and if present, the device isolation layer 165. In addition, after a third resist pattern R3 is formed the insulating film in locations that overlap the gates 160 except in locations for forming a gate contact (not shown), the insulating film is etched using the third resist pattern R3 as a mask. Accordingly, an interlayer insulating layer 170 covering the surfaces of the gate region 160 and (when present) the device isolation layer 165 is formed. Then, the third resist pattern R3 is removed.

Figure 11:
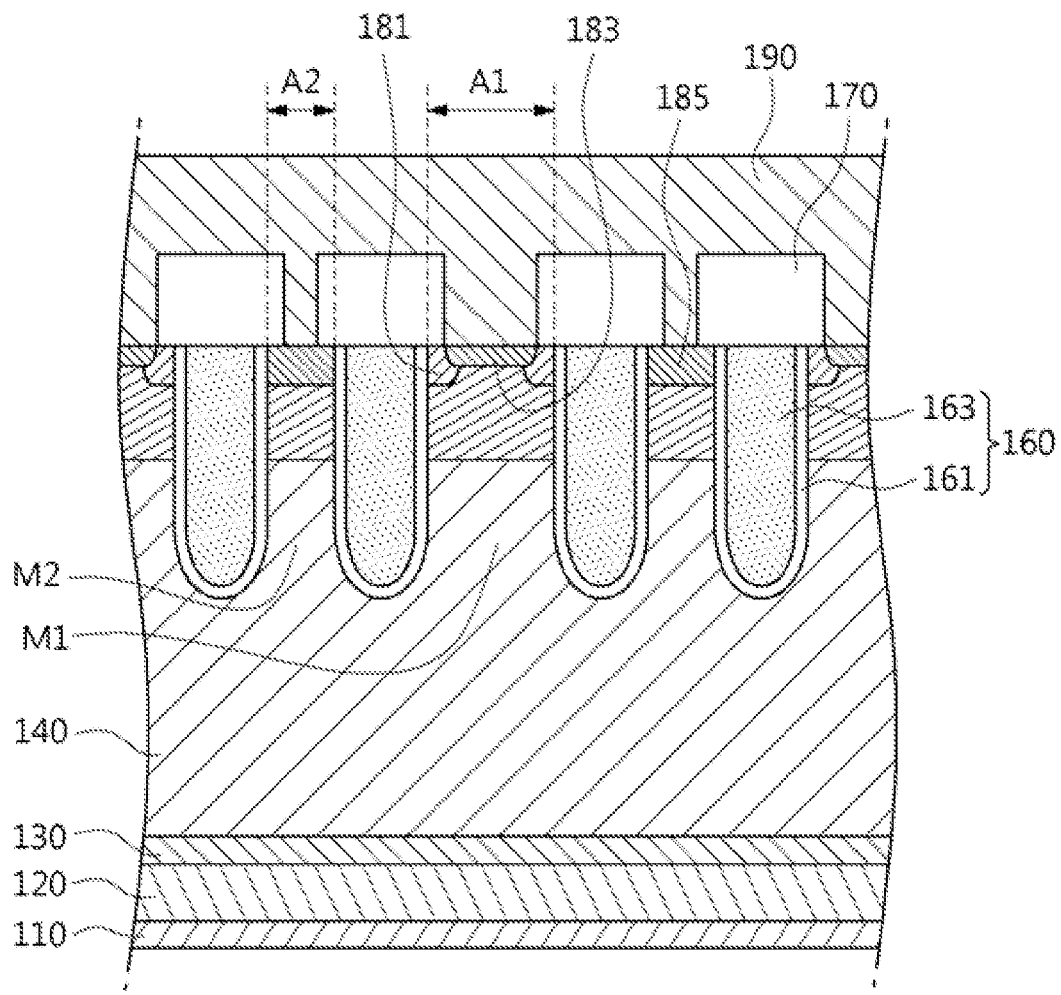

In addition, referring to FIG. 11, a conductive layer is deposited on the exposed first and second body contact regions 183 and 185 and the interlayer insulating layer 170, thereby forming gate wiring and a gate pad and/or an emitter electrode 190.

Finally, a collector electrode 110 is formed on the surface of the collector layer 120. The collector electrode 110 may be or comprise a metal alloy of aluminum, such as AlMoNiAu, as described above.

The foregoing detailed description illustrates the present invention. In addition, the foregoing is intended to illustrate and explain the various embodiments of the present invention, and the present invention may be used in various other combinations, modifications, and environments. That is, it is possible to change or modify the scope of the concept of the invention disclosed in this specification, the scope of disclosure and the equivalent scope and/or the skill or knowledge of the present invention. The above-described embodiments illustrate the various modes for carrying out the technical idea of the present invention, and various modifications can be made in the specific applications and uses of the present invention. Therefore, the detailed description of the invention is not intended to limit the invention to the disclosed embodiments.

What is claimed is:

1. An insulated gate bipolar transistor, comprising:
   a collector electrode;
   a collector layer on the collector electrode, the collector layer having a first conductivity type;
   a buffer layer on the collector layer, the buffer layer having a second conductivity type;
   a drift region on the buffer layer, the drift region having the second conductivity type;
   a body region on the drift region, the body region having the first conductivity type;

a plurality of trench gates penetrating the body region, configured to separate a first region from a second region in the body region;

an interlayer insulating film covering a surface of the trench gates;

emitters spaced apart from each other on a surface of the body region in the first region, the emitters having the second conductivity type an emitter electrode on the interlayer insulating film;

a first body contact overlapping each of the emitters in the first region and in contact with the emitter electrode; and a second body contact on or at the surface of the body region in the second region and in contact with the emitter electrode, wherein the first region includes a first mesa, the second region is adjacent to the first region and includes a second mesa, and the first mesa has a width larger than that of the second mesa.

2. The transistor of claim 1, wherein adjacent ones of the trench gates are at boundaries of the first region and the second region.

3. The transistor of claim 1, wherein each of the first and second body contact regions have the first conductivity type.

4. The transistor of claim 1, wherein the first region and the second region are repetitive.

5. The transistor of claim 1, further comprising a plurality of the second regions adjacent to the first region; and a device isolation layer penetrating the body region, configured to form a boundary between adjacent ones of the second regions in the body region.

6. The transistor of claim 1, wherein adjacent ones of the trench gates are on boundaries of the first region and the second region, and include a gate insulating layer having an oxide film along an inner wall and a gate electrode on an inner surface of the gate insulating layer.

7. The transistor of claim 1, wherein a distance between adjacent trench gates at opposite boundaries of the first region is different from a distance between adjacent trench gates at opposite boundaries of the second region.

* * * * *